(12) United States Patent
Na et al.

(10) Patent No.: US 10,666,249 B2
(45) Date of Patent: May 26, 2020

(54) SEMICONDUCTOR PACKAGE

(71) Applicant: Samsung Electronics Co., Ltd., Suwon-si, Gyeonggi-do (KR)

(72) Inventors: Dae Hoon Na, Seoul (KR); Seon Kyoo Lee, Hwaseong-si (KR); Jeong Don Ihm, Seongnam-si (KR); Byung Hoon Jeong, Hwaseong-si (KR); Young Don Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/206,070

(22) Filed: Nov. 30, 2018

(65) Prior Publication Data
US 2020/0014383 A1 Jan. 9, 2020

(30) Foreign Application Priority Data
Jul. 3, 2018 (KR) .......................... 10-2018-0076997

(51) Int. Cl.
*G11C 8/12* (2006.01)
*H01L 25/065* (2006.01)
*H03K 17/22* (2006.01)
*H01L 23/48* (2006.01)

(52) U.S. Cl.
CPC .............. *H03K 17/22* (2013.01); *G11C 8/12* (2013.01); *H01L 23/481* (2013.01); *H01L 25/0657* (2013.01); *H01L 2225/06513* (2013.01)

(58) Field of Classification Search
CPC ..... H03K 17/22; H01L 23/481; H01L 2/0657; H01L 2225/06513; H01L 25/0657; G11C 8/12
See application file for complete search history.

(56) References Cited

U.S. PATENT DOCUMENTS

| | | |
|---|---|---|
| 5,978,276 A | 11/1999 | Wong |
| 8,203,885 B2 | 6/2012 | Abiko et al. |
| 8,274,316 B2 * | 9/2012 | Jin .......................... H03K 17/22 327/143 |
| 8,310,841 B2 | 11/2012 | Foster, Sr. et al. |
| 8,605,508 B2 | 12/2013 | Itagaki et al. |
| 8,659,018 B2 | 2/2014 | Shimada et al. |
| 8,713,349 B2 | 4/2014 | Byeon et al. |

(Continued)

*Primary Examiner* — Patrick O Neill
(74) *Attorney, Agent, or Firm* — Harness, Dickey & Pierce, P.L.C.

(57) ABSTRACT

A semiconductor package including a first master-slave status circuit configured to store one of a first signal or a second signal independently from a second master-slave status circuit, store the first signal in response to receiving a first initial signal from a first initialization circuit, the second master-slave status circuit configured to store one of the first signal or the second signal, store the first signal in response to receiving a second initial signal from a second initialization circuit, the first initialization circuit configured to provide the first initial signal to the first master-slave status circuit, the second initialization circuit configured to provide the second initial signal to the second master-slave status circuit, and a first master-slave determination circuit connected to the second master-slave status circuit, the first master-slave determination circuit configured to provide the second signal to the second master-slave status circuit may be provided.

20 Claims, 9 Drawing Sheets

(56) References Cited

U.S. PATENT DOCUMENTS

| | | |
|---|---|---|
| 8,760,181 B2 | 6/2014 | Byeon et al. |
| 8,817,547 B2 | 8/2014 | Veches et al. |
| 8,862,863 B2 | 10/2014 | Kim et al. |
| 8,891,308 B1 | 11/2014 | Ou et al. |
| 8,996,836 B2 | 3/2015 | Ito et al. |
| 9,019,775 B2 | 4/2015 | Costa et al. |
| 9,153,533 B2 | 10/2015 | Haba et al. |
| 9,263,143 B2 | 2/2016 | Hsu et al. |
| 9,548,123 B2 | 1/2017 | Choe et al. |
| 10,014,038 B2 * | 7/2018 | Morohashi ........... G11C 7/1084 |
| 10,319,451 B2 * | 6/2019 | Loh ........................ G11C 17/16 |
| 2006/0170459 A1 * | 8/2006 | Shin ..................... H03K 17/693 326/113 |
| 2012/0124408 A1 * | 5/2012 | Byeon ..................... G11O 5/04 713/501 |
| 2017/0292995 A1 * | 10/2017 | Semenov ......... G01R 31/31701 |

* cited by examiner

SEMICONDUCTOR PACKAGE

CROSS-REFERENCE TO RELATED APPLICATIONS

This application claims priority to Korean Patent Application No. 10-2018-0076997, filed on Jul. 3, 2018, and all the benefits accruing therefrom under 35 U.S.C. § 119, the disclosure of which is incorporated herein by reference in its entirety.

BACKGROUND

1. Field

The present inventive concepts relate to semiconductor packages. More specifically, the present inventive concepts relate to semiconductor packages including a through-silicon via and including an initialization circuit for distinguishing a master chip from a slave chip, a master-slave status circuit, and a master-slave determination circuit.

2. Description of the Related Art

In order to implement a large capacity memory system, a multi-chip package (MCP) including a plurality of memory chips is widely used.

In such a multi-chip package, a bonding wire may be used to individually wire the plurality of memory chips to each other. However, wiring using such bonding wires may have restrictions on a high-speed input/output operation.

In order to solve such problems, a through-silicon via (TSV) technique has been recently used. In a multi-chip package formed by using the through-silicon via (TSV) technique, not every chip stacked in a multi-chip package is connected to outside the package. For example, a master chip from among the stacked chips is connected to the outside, and a slave chip from among the stacked chips and stacked on the master chip is not connected to the outside.

As described above, in the multi-chip package using the through-silicon via technique, because only the master chip is connected to the outside, different controls are desired for the master chip and the slave chip. However, because the constituent elements included in the master chip and the slave chip are the same or substantially similar to each other, it may be difficult to distinguish the master chip from the slave chip based on the presence or absence of one or more specific constituent elements. Therefore, a specific configuration for distinguishing the master chip from the slave chip may be required.

SUMMARY

Some example embodiments of the present inventive concepts provide semiconductor packages with reduced power consumption.

Some example embodiments of the present inventive concepts provide semiconductor packages with reduced operation latency.

According to an example embodiment of the present inventive concepts, a semiconductor package includes a first master-slave status circuit configured to store one of a first signal of a first level or a second signal of a second level, the first master-slave status circuit configured to store the first signal in response to receiving a first initial signal from a first initialization circuit, the first master-slave status circuit configured to store one of the first signal or the second signal independently from the one of the first signal or the second signal stored in a second master-slave status circuit, the second master-slave status circuit configured to store one of the first signal or the second signal, the second master-slave status circuit configured to store the first signal in response to receiving a second initial signal from a second initialization circuit, the first initialization circuit configured to provide the first initial signal to the first master-slave status circuit, the second initialization circuit configured to provide the second initial signal to the second master-slave status circuit, and a first master-slave determination circuit connected to the second master-slave status circuit, the first master-slave determination circuit configured to provide the second signal to the second master-slave status circuit.

According to an example embodiment of the present inventive concepts, a semiconductor package includes a first chip including a first master-slave status circuit configured to store one of a first signal of a first level or a second signal of a second level, and a first initialization circuit configured to initialize the first master-slave status circuit, and a second chip including a second master-slave status circuit configured to store one of the first signal or the second signal, a second initialization circuit configured to initialize the second master-slave status circuit, and a second master-slave determination circuit connected to the first master-slave status circuit, receive the one of the first signal or the second signal stored in the first master-slave status circuit, invert the one of the first signal or the second signal received from the first master-slave status circuit, and provide the inverted signal of the one of the first signal or the second signal to the first master-slave status circuit.

According to an example embodiment of the present inventive concepts, a semiconductor includes a first chip including a first master-slave status circuit configured to store one of a first signal of a first level or a second signal of a second level, a first master-slave determination circuit configured to receive one of a first signal or a second signal from the second master-slave status circuit, invert the one of the first signal or the second signal, and provide the inverted one of the first signal or the second signal to the second master-slave status circuit, the first master-slave determination circuit connected to a second master-slave status circuit, a first input buffer configured to store first data, a first internal circuit configured to process the first data, and a first switch configured to control connection between the first input buffer and the first internal circuit based on a signal from the first master-slave status circuit, and a second chip on the first chip, the second chip including the second master-slave status circuit configured to store one of the first signal or the second signal, a second input buffer configured to store second data, a second internal circuit configured to process the second data, a second switch configured to control connection between the second input buffer and the second internal circuit based on a signal from the second master-slave status circuit, and a third switch configured to control connection between the first input buffer and the second internal circuit based on the signal from the second master-slave status circuit.

The aspects of the present inventive concepts are not restricted to those mentioned above and another aspect which is not mentioned may be clearly understood by those skilled in the art from the description below.

BRIEF DESCRIPTION OF THE DRAWINGS

The above and other aspects and features of the present inventive concepts will become more apparent by describing in detail some example embodiments thereof with reference to the attached drawings, in which.

DETAILED DESCRIPTION

Figure 1:
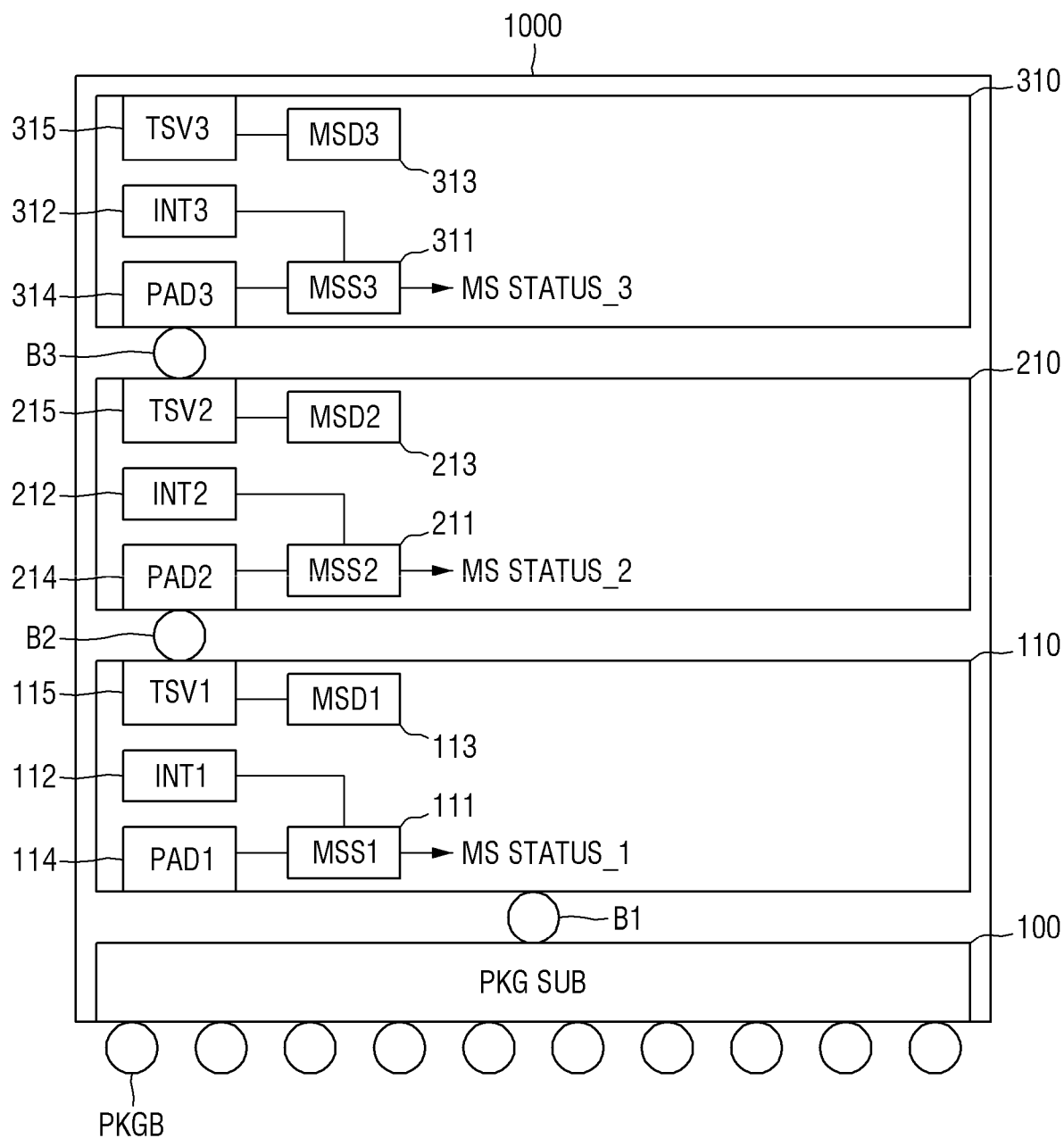
FIG. 1 is an example diagram for illustrating a semiconductor package according to an example embodiment.

FIG. 1 is an example diagram for illustrating a semiconductor package 1000 according to an example embodiment.

Referring to FIG. 1, a semiconductor package 1000 according to some embodiments includes a package substrate 100, a first chip 110, a second chip 210, a third chip 310, first to third bumps B1 to B3, and a package ball PKGB.

According to the example embodiment, the first to third chips 110, 210 and 310 may be sequentially disposed on the package substrate 100. For example, the first chip 110 may be disposed on the package substrate 100. Also, the second chip 210 may be disposed on the first chip 110. Also, the third chip 310 may be disposed on the second chip 210. The package substrate 100 and the first chip 110 may be connected by a first bump B1. The first chip 110 may be connected to the second chip 210 by a second bump B2. The second chip 210 may be connected to the third chip 310 by a third bump B3. Detailed description thereof will be provided later.

The constituent elements included in the first to third chips 110, 210 and 310 may be the same as or substantially similar to each other. The expression "the constituent elements are the same as or substantially similar to each other" means that the shapes, forms, functions, positions, and the like of each constituent element are the same as or substantially similar to each other, taking into account a process error or a manufacturing error during the manufacturing process.

The first chip 110 may include a first master-slave status circuit 111 (MSS1), a first initialization circuit 112 (INT1), a first master-slave determination circuit 113 (MSD1), a first pad 114 (PAD1), and a first through-silicon via 115 (TSV1).

The first master-slave status circuit 111 may provide the first master-slave status signal MS STATUS_1 to other constituent elements inside the first chip 110. The first master-slave status signal MS STATUS_1 may be a signal stored in the first master-slave status circuit 111 after a specific time point (for example, a second time point Ts of FIG. 3). The first master-slave status circuit 111 may include, for example, a latch circuit.

The first initialization circuit 112 may be connected to the first master-slave status circuit 111. The first initialization circuit 112 may initialize the first master-slave status circuit 111. For example, the first initialization circuit 112 may provide a first initial signal to the first master-slave status circuit 111 to initialize the first master-slave status circuit 111. The signal stored in the initialized first master-slave status circuit 111 may be, for example, a first signal of a first level. In other words, when the first initialization circuit 112 initializes the first master-slave status circuit 111, the first master-slave status circuit 111 may store the first signal of the first level. For example, the first level may be a logic low level (0) or a logic high level (1).

In some example embodiments, if the power provided to the first chip 110 reaches a desired first power level (L1 of FIG. 3), the first initialization circuit 112 may initialize the first master-slave status circuit 111. For example, the first initialization circuit 112 may be a power level detection (PLD) device.

That is, when a power equal to or greater than the desired first power level (L1 of FIG. 3) is provided to the first chip 110, the first initialization circuit 112 may initialize the first master-slave status circuit 111 to store the first signal of the first level.

The first master-slave determination circuit 113 may invert the received signal, and further may provide the inverted signal to another constituent element. For example, the first master-slave determination circuit 113 may receive a signal from the second master-slave status circuit 211. Further, the first master-slave determination circuit 113 may provide the inverted signal to the second master-slave status circuit 211. In some example embodiments, the inverted signal may be a second signal of a second level. For example, the second level may be a logic high level (1) or a logic low level (0). For example, the first master-slave determination circuit 113 may include an inverter.

In some example embodiments, the first master-slave status circuit 111 and the first master-slave determination circuit 113 may be implemented as a digital circuit. Accordingly, the semiconductor package 1000 according to some embodiments may have relatively low power consumption and low operation latency.

The first chip 110 may be connected to the package substrate 100. For example, the first chip 110 may be connected to the package substrate 100 via the first bump B1. The first master-slave status circuit 111 may be connected to the first pad 114. Further, the first master-slave determination circuit 113 may be connected to the first through-silicon via 115.

The second chip 210 may include a second master-slave status circuit 211 (MSS2), a second initialization circuit 212 (INT2), a second master-slave determination circuit 213 (MSD2), a second pad 214 (PAD2), and a second through-silicon via 215 (TSV2). As described above, because the constituent elements included in the second chip 210 are the same as or substantially similar to those included in the first chip 110, duplicated descriptions will be omitted or briefly explained.

The second master-slave status circuit 211 may provide the second master-slave status signal MS STATUS_2 to other constituent elements inside the second chip 210.

The second initialization circuit 212 may be connected with the second master-slave status circuit 211. In some example embodiments, when a power greater than or equal to a desired first power level (L1 of FIG. 3) is provided to the second chip 210, the second initialization circuit 212 may initialize the second master-slave status circuit 211 to store the first signal of the first level.

The second master-slave determination circuit 213 may invert the received signal. Further, the second master-slave determination circuit 213 may provide the inverted signal to another constituent element.

The second master-slave status circuit 211 may be connected to the second pad 214. The second master-slave determination circuit 213 may be connected to the second through-silicon via 215. The second chip 210 may be connected to the first chip 110 via the second bump B2. For example, the first through-silicon via 115 included in the first chip 110 may be connected to the second bump B2. Further, the second pad 214 included in the second chip 210 may be connected to the second bump B2. Therefore, by connecting each of the first through-silicon via 115 and the second pad 214 to the second bump B2, the first chip 110 and the second chip 210 may be connected to each other. Thus, the first master-slave determination circuit 113 may be connected to the second master-slave status circuit 211 through the first through-silicon via 115, the second bumps B2, and the second pad 214.

In some example embodiments, the first master-slave determination circuit 113 receives the signal from the second master-slave status circuit 211, and may invert the signal to provide the inverted signal to the second master-slave status circuit 211. For example, the first master-slave determination circuit 113 may receive the first signal of the first level stored in the second master-slave status circuit 211 through the second pad 214, the second bump B2, and the first through-silicon via 115. The first master-slave determination circuit 113 may invert the first signal of the first level received from the second master-slave status circuit 211 to generate the second signal of the second level. The second signal of the second level generated by the first master-slave determination circuit 113 may be provided to the second master-slave status circuit 211 through the first through-silicon via 115, the second bump B2, and the second pad 214.

The third chip 310 may include a third master-slave status circuit 311 (MSS3), a third initialization circuit 312 (INT3), a third master-slave determination circuit 313 (MSD3), a third pad 314 (PAD3), and third through-silicon via 315 (TSV3). As described above, because the constituent elements included in the third chip 310 are the same as or substantially similar to those included in the first chip 110, duplicated descriptions will be omitted or briefly explained.

The third master-slave status circuit 311 may provide the third master-slave status signal MS STATUS_3 to other constituent elements inside the third chip 310.

The third initialization circuit 312 may be connected with the third master-slave status circuit 311. In some embodiments, when a power greater than or equal to a desired first power level (L1 of FIG. 3) is provided to the third chip 310, the third initialization circuit 312 may initialize the third master-slave status circuit 311 to store the first signal of the first level.

The first to third initialization circuits 112, 212 and 312 may independently initialize the first to third master-slave status circuits 111, 211 and 311, respectively. For example, regardless of whether or not the second initialization circuit 212 or the third initialization circuit 312 operates, the first initialization circuit 112 may initialize the first master-slave status circuit 111. That is, even if a power is not received by the second chip 210 and the third chip 310, the first initialization circuit 112 may initialize the first master-slave status circuit 111. Further, the second and third initialization circuits 212 and 312 may initialize the second and third master-slaves status circuits 211 and 311, respectively, regardless of whether other initialization circuits operate. Because the first to third initialization circuits 112, 212 and 312 independently initializes the first to third master-slave status circuits 111, 211 and 311, respectively, the first to third master-slave status circuits 111, 211 and 311 may initialize in parallel. For example, when a power is supplied from the outside to the first to third chips 110, 210 and 310, the first to third master-slave status circuits 111, 211 and 311 may initialize substantially at the same time. The expression "substantially at the same time" as used herein takes into account an operation error and/or a measurement error. Because the first to third master-slave status circuits 111, 211 and 311 can execute respective initialization operations in parallel, the operation latency of the semiconductor package 1000 may decrease.

The third master-slave determination circuit 313 may invert the received signal. Further, the third master-slave determination circuit 313 may provide the inverted signal to another constituent element.

The third master-slave status circuit 311 may be connected to the third pad 314. Further, the third master-slave determination circuit 313 may be connected to the third through-silicon via 315.

The third chip 310 may be connected to the second chip 210 via the third bump B3. Since a connection relation between the second chip 210 and the third chip 310 is the same as a connection relation between the first chip 110 and the second chip 210, a repeated content will be omitted or briefly explained. The second master-slave determination circuit 213 may be connected to the second through-silicon via 215. The third master-slave status circuit 311 may be connected to the third pad 314. Accordingly, the second master-slave determination circuit 213 may be connected to the third master-slave status circuit 311. In some example embodiments, the second master-slave determination circuit 213 may receive the signal from the third master-slave status circuit 311, and may invert the signal to provide the inverted signal to the third master-slave status circuit 311.

In some example embodiments, each of the signals stored in the first to third master-slave status circuits 111, 211 and 311 may be independently determined. For example, the first master-slave status circuit 111 may be initialized regardless of operation of the second and third initialization circuits 212 and 312 or regardless of the signal stored in the second and third master-slave status circuits 211 and 311. Further, for example, reception of signal of the first master-slave determination circuit 113 from the second master-slave status circuit 211 may be independently executed, regardless of the operation of the second master-slave determination circuit 213, or regardless of the signals stored in the first and third master-slave status circuits 111 and 311. Further, the inverted signal of the first master-slave determination circuit 113 may be independently provided to the second master-slave status circuit 211 regardless of the operation of the second master-slave determination circuit 213, or regardless of the signals stored in the first and third master-slave status circuits 111 and 311. Therefore, the signals stored in the first to third master-slave status circuits 111, 211 and 311 may be determined in parallel, that is, substantially at the same time. Because the signals stored in the first to third master-slave status circuits 111, 211 and 311 are determined in parallel, the latency of the semiconductor package 1000 may decrease.

The package substrate 100 may be connected to the outside. For example, the package substrate 100 may be connected to the outside via the package ball PKGB. According to some example embodiments, specific signals may be provided to the package ball PKGB from the outside. A specific signal provided to the package ball PKGB may be provided to the package substrate 100.

Figure 2:
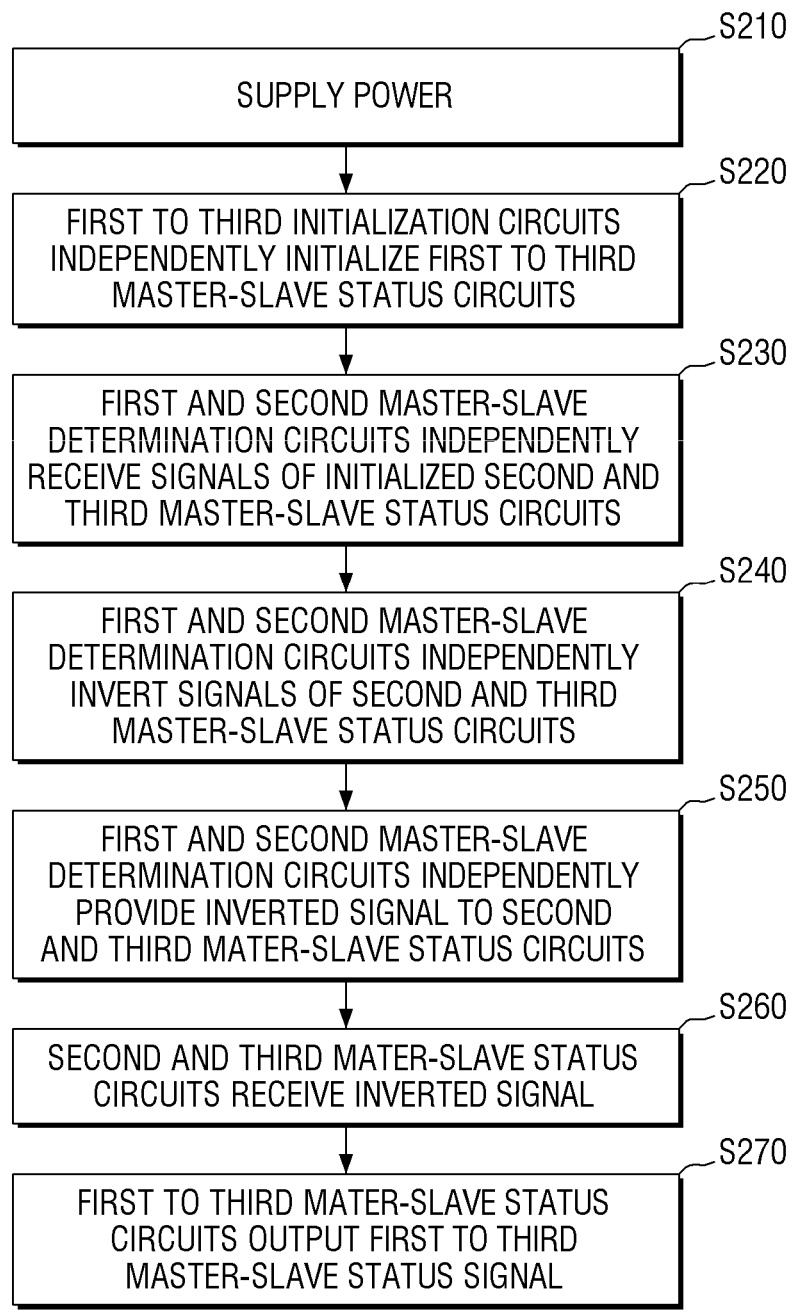
FIG. 2 is an example flowchart for explaining operations of the semiconductor package of FIG. 1, according to an example embodiment.
Figure 3:
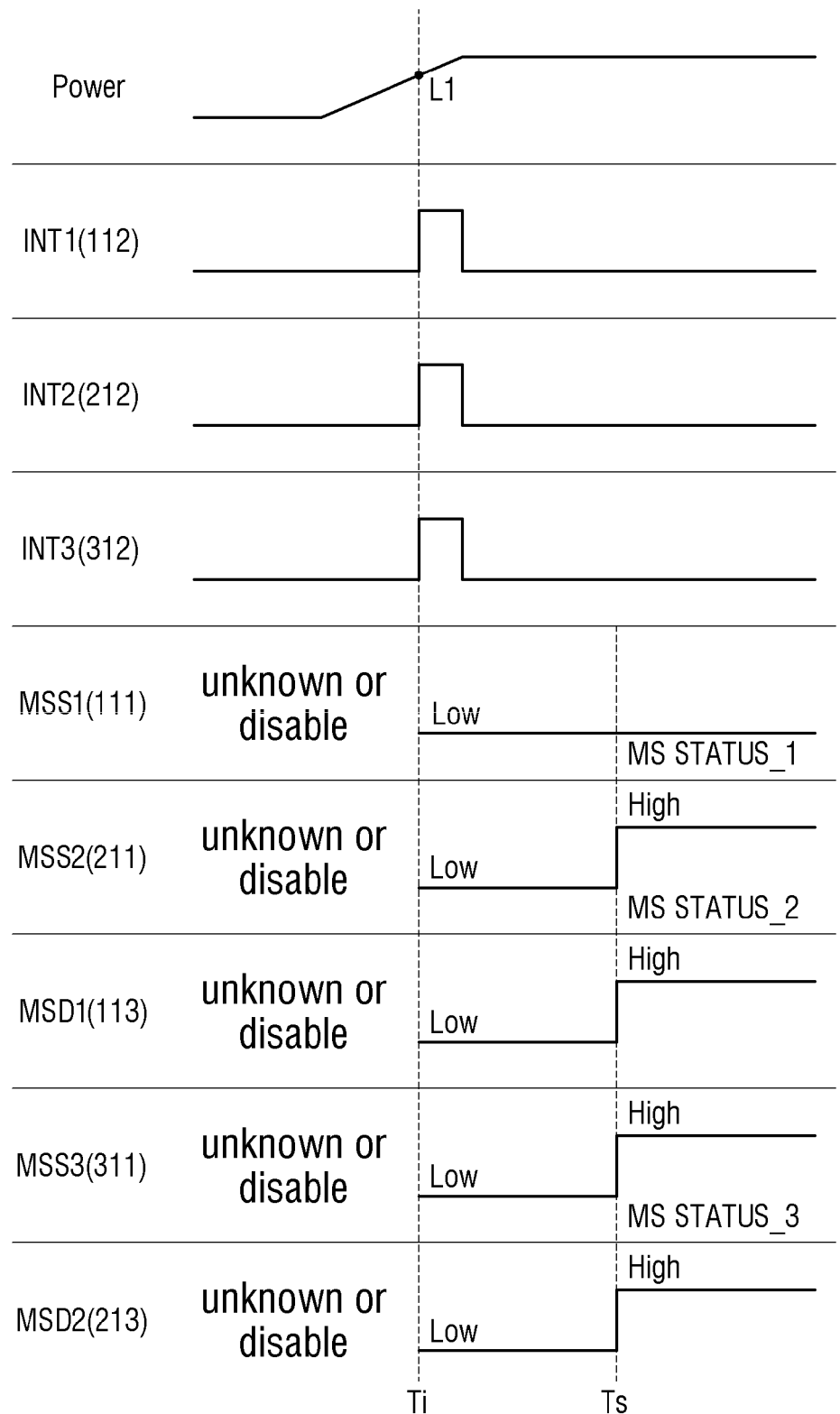
FIG. 3 is an example timing diagram for describing the operations of the semiconductor package of FIG. 1, according to an example embodiment.

FIG. 2 is an example flowchart for explaining operations of the semiconductor package 1000 according to an example embodiment. FIG. 3 is an example timing diagram for the operations of FIG. 2, according to an example embodiment.

Referring to FIGS. 1 to 3, a power may be supplied from the outside to the semiconductor package 1000 (S210). When the semiconductor package 1000 receives the power, the power may be provided to each of the first to third chips 110, 210 and 310.

The first to third initialization circuits 112, 212 and 312 may independently initialize the first to third master-slave status circuits 111, 211 and 311, respectively (S220). For example, when the power supplied to the first to third chips 110, 210 and 310 from outside reaches the first power level L1 or higher, the first to third initialization circuits 112, 212 and 312 may independently generate the first to third initial signals, respectively. The first to third initial signals may be independently provided to the first to third master-slave status circuits 111, 211 and 311, respectively. When the first to third master-slave status circuits 111, 211 and 311 receive the first to third initial signals, respectively, the first to third master-slave status circuits 111, 211 and 311 may independently store the first signal of the first level, respectively. For example, the first master-slave status circuit 111 may independently store the first signal of the first level when receiving the first initial signal, the second master-slave status circuit 211 may independently store the first signal of the first level when receiving the second initial signal, the third master-slave status circuit 311 may independently store the first signal of the first level when receiving the third initial signal. For example, the first level may be a logic low level (0). In some example embodiments, the first to third initial signals may be the same or substantially identical to each other, but example embodiments are not limited thereto.

According to some example embodiments, the first to third master-slave status circuits 111, 211 and 311 may be in an unknown status or in a disable status before the first time point Ti at time point at which the first to third master-slave status circuits 111, 211 and 311 are initialized.

FIG. 3 illustrates a state in which the first to third initialization circuits 112, 212 and 312 generates first to third initial signals, respectively, and the first to third master-slave status circuits 111, 211 and 311 are initialized at the same time for convenience of explanation. However, example embodiments are not limited thereto.

Further, although FIG. 3 illustrates the first to third initial signals in the form of pulse signals, example embodiments are not limited thereto. For example, the first to third initial signals may be step signals, or may be other forms of signals.

In the example embodiment, each of the first to third master-slave status circuits 111, 211 and 311 store the first signal of the desired first level when receiving the first to third initial signals. However, example embodiments are not limited thereto. Those having ordinary skill in the technical field of the present inventive concepts may initialize the first to third master-slave status circuits 111, 211 and 311 in various ways.

The first and second master-slave determination circuits 113 and 213 may independently receive the signals stored in the initialized second and third master-slave status circuits 211 and 311, respectively (S230). For example, the first master-slave determination circuit 113 may receive the signal stored in the initialized second master-slave status circuit 211. For example, the first master-slave determination circuit 113 may receive the first signal of the first level stored in the second master-slave status circuit 211. Further, the second master-slave determination circuit 213 may receive the signal stored in the third master-slave status circuit 311. For example, the second master-slave determination circuit 213 may receive the first signal of the first level stored in the third master-slave status circuit 311.

FIG. 3 illustrates that a first time point Ti at which the second and third master-slave status circuits 211 and 311 are initialized is the same as the first time point Ti at which the first and second master-slave determination circuits 113 and 213 receive the signals stored in the second and third master-slave status circuits 211 and 311, respectively, for convenience of explanation. However, example embodiments are not limited thereto. For example, a time point at which the second and third master-slave status circuits 211 and 311 are initialized may be slightly different from the time point at which the first and second master-slave determination circuits 113 and 213 receive the signals stored in the second and third master-slave status circuits 211 and 311, respectively.

The first and second master-slave determination circuits 113 and 213 may invert the received signals, respectively (S240). For example, the first master-slave determination circuit 113 may invert the signal received from the second master-slave status circuit 211. For example, the first master-slave determination circuit 113 may receive the first signal of the first level from the second master-slave status circuit 211 and may generate the second signal of the second level which is an inverted signal of the first signal of the first level. Further, independently from the operation of the first master-slave determination circuit 113, the second master-slave determination circuit 213 may invert the signal received from the third master-slave status circuit 311. For example, the second master-slave determination circuit 213 may receive the first signal of the first level from the third master-slave status circuit 311, and may generate the second signal of the second level. For example, the second level may be a logic high level (1).

The first and second master-slave determination circuits 113 and 213 may independently provide the inverted signals to the second and third master-slave status circuits 211 and 311, respectively (S250). For example, the first master-slave determination circuit 113 may provide the second signal of the second level to the second master-slave status circuit 211, and independently from this operation, the second master-slave determination circuit 213 may provide the second signal of the second level to the third master-slave status circuit 311.

The second and third master-slave status circuits 211 and 311 may independently receive the inverted signals from the first and second master-slave determination circuits 113 and 213, respectively (S260). For example, the second master-slave status circuit 211 may receive the second signal of the second level from the first master-slave determination circuit 113, and independently from this operation, the third master-slave status circuit 311 may receive the second signal of the second level from the second master-slave determination circuit 213.

FIG. 3 illustrates that the second time point Ts at which the first and second master-slave determination circuits 113 and 213 invert the received signals, respectively, the second time point Ts at which first and second master-slave determination circuits 113 and 213 provide the inverted signals, respectively, and the second time point Ts at which the second and third master-slave status circuits 211 and 311 receive the inverted signals, respectively, are the same for convenience of explanation. However, example embodiments are not limited thereto.

The first to third master-slave status circuits 111, 211 and 311 may output the first to third master-slave status signals (MS STATUS_1 to MS STATUS_3), respectively (S270). For example, after the second time point Ts, the signals stored in the first to third master-slave status circuits 111, 211 and 311 may be the first to third master-slave status signals (MS STATUS_1 to MS STATUS_3), respectively.

The signal stored in the first master-slave status circuit 111 may be the first signal of the first level. In other words, the first master-slave status circuit 111 may output the first signal of the first level to the first master-slave status signal MS STATUS_1.

Figure 4:
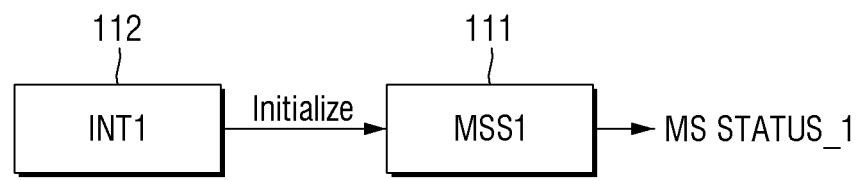
FIG. 4 is an example diagram illustrating a process of determining the first master-slave status signal according to an example embodiment.
Figure 5:
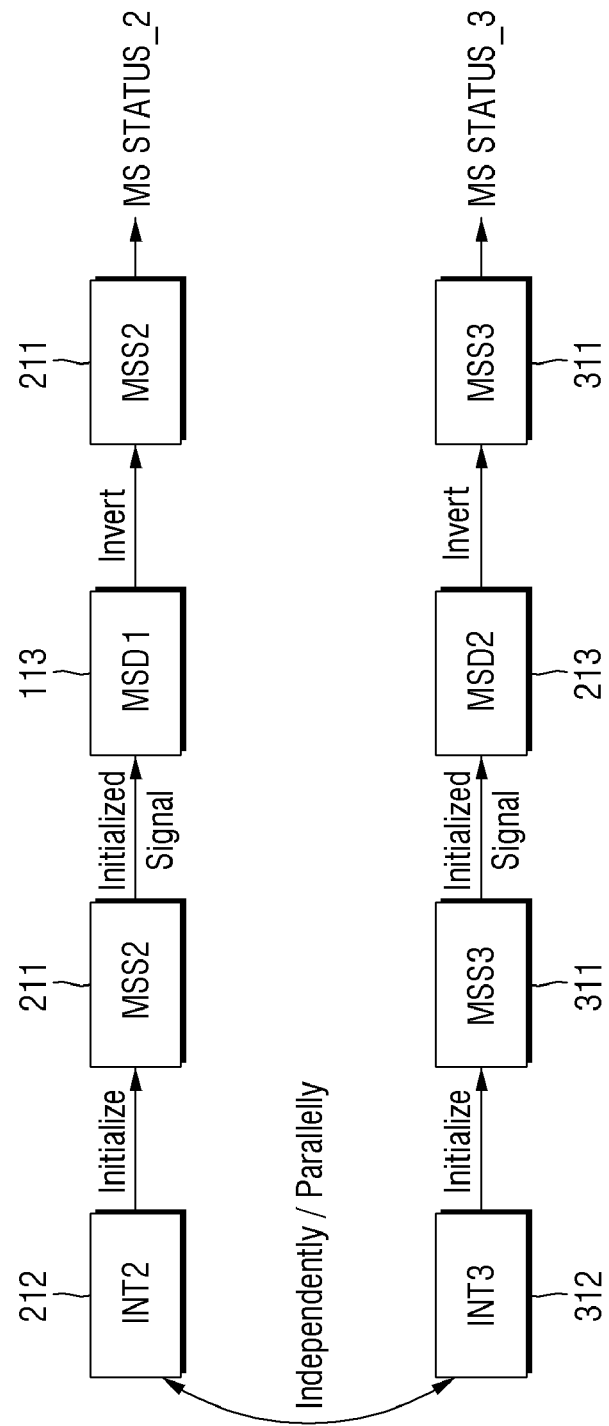
FIG. 5 is an example diagram illustrating a process of determining the second and third master-slave status signals according to an example embodiment.

Between the first time point Ti and the second time point Ts, the signals stored in the second and third master-slave status circuits 211 and 311 may be the first signal of the first level. After the second time point Ts, the signals stored in the second and third master-slave status circuits 211 and 311 may be the second signal of the second level. In other words, the second and third master-slave status circuits 211 and 311 may output the second signal of the second level to the second and third master-slave status signals MS (STATUS_2, and MS STATUS_3), respectively. With reference to FIGS. 4 and 5, the process of determining the first to third master-slave status signals (MS STATUS_1 to MS STATUS_3) will be described.

FIG. 4 is an example diagram illustrating a process of determining the first master-slave status signal MS STATUS_1 according to an example embodiment. FIG. 5 is an example diagram illustrating a process of determining the second and third master-slave status signals (MS STATUS_2, and MS STATUS_3) according to an example embodiment.

Referring to FIG. 4, the first initialization circuit 112 may initialize the first master-slave status circuit 111. When the first master-slave status circuit 111 is initialized, the first master-slave status circuit 111 may store the first signal of the first level. Thereafter, since no other signal is provided to the first master-slave status circuit 111, the first master-slave status circuit 111 may maintain the first signal of the first level. Therefore, the first master-slave status signal MS STATUS_1 may be the first signal of the first level.

Referring to FIG. 5, the second initialization circuit 212 may initialize the second master-slave status circuit 211. When the second master-slave status circuit 211 is initialized, the second master-slave status circuit 211 may store the first signal of the first level. The second master-slave status circuit 211 may provide the initial signal (e.g., the first signal of the first level) to the first master-slave determination circuit 113. The first master-slave determination circuit 113 may invert the received first signal of the first level, and may provide the second signal of the second level to the second master-slave status circuit 211 again. Because no other signal is provided to the second master-slave status circuit 211, the second master-slave status signal MS STATUS_2 may be the second signal of the second level. The process of generating the third master-slave status signal MS STATUS_3 may be similar to the process of generating the second master-slave status signal MS STATUS_2. Therefore, the third master-slave status signal MS STATUS_3 may be the second signal of the second level. In some example embodiments, the second master-slave status signal MS STATUS_2 may be determined independently from and in parallel with the third master-slave status signal MS STATUS_3.

In some example embodiments, assuming that all the external influence such as a noise are ignored, the signal finally stored in the first master-slave status circuit 111 (e.g., the first master-slave status signal MS STATUS_1) may be determined only by the first initialization circuit 112. Further, the signals finally stored in the second and third master-slave status circuits 211 and 311 (e.g., the second and third master-slave status signals MS STATUS_2 and MS STATUS_3) may be determined by the first and second master-slave determination circuits 113 and 213, respectively.

Referring to FIGS. 1 to 5, the first chip 110 may not have another chip connected to the lower part thereof. Therefore, no master-slave determination circuit may be connected to the first master-slave status circuit 111. Therefore, after the first time point Ti at which the first master-slave status circuit 111 is initialized, no other signal may be provided to the first master-slave status circuit 111. On the other hand, the first chip 110 may be connected to the lower part of the second chip 210, and the second chip 210 may be connected to the lower part of the third chip 310. Therefore, at the second time point Ts, the second master-slave status circuit 211 may receive the second signal of the second level from the first master-slave determination circuit 113, and the third master-slave status circuit 311 may receive the second signal of the second level from the second master-slave determination circuit 213. Therefore, the first master-slave status signal MS STATUS_1 may have a level different from the second and third master-slave status signals MS STATUS_2 and MS STATUS_3.

According to some embodiments, when the master-slave status signal is the first signal of the first level, the chip which includes the master-slave status circuit for outputting the master-slave status signal may be identified as a master chip. According to some example embodiments, when the master-slave status signal is the second signal of the second level, the chip which includes the master-slave status circuit for outputting the master-slave status signal may be identified as a slave chip. According to the example embodiments disclosed above, since the first master-slave status circuit 111 outputs the first signal of the first level to the first master-slave status signal MS STATUS_1, the first chip 110 may be identified as the master chip. Further, because the second and third master-slave status circuits 211 and 311 output the second signal of the second level to the second and third master-slave status signals MS STATUS_2 and MS STATUS_3, respectively, the second and third chips 210 and 310 may be identified as the slave chips.

Figure 6:
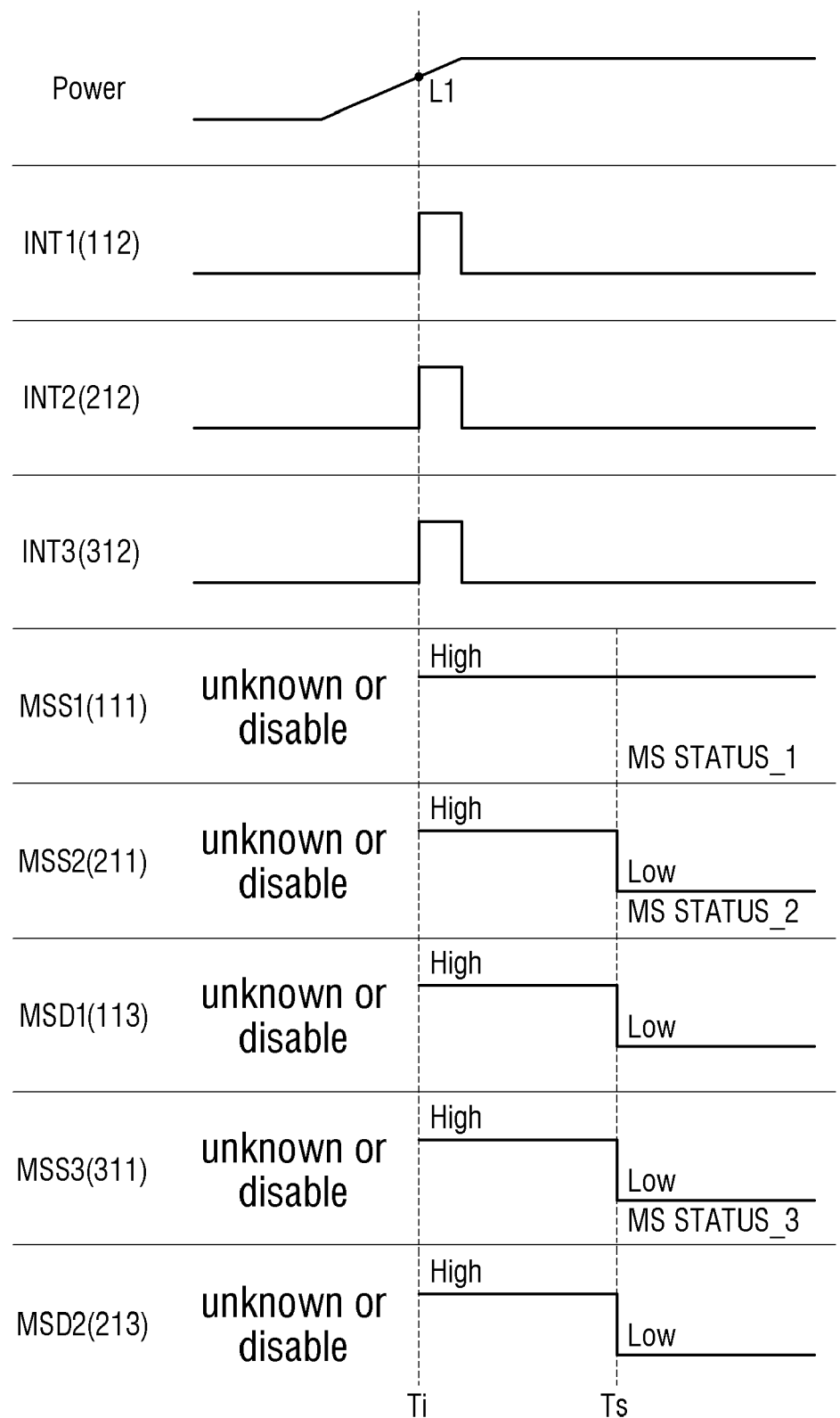
FIG. 6 is an example timing diagram for explaining operations of the semiconductor package of FIG. 1 according to another example embodiment.

FIG. 6 is an example timing diagram for explaining operations of the semiconductor package 1000 according to another example embodiment. For convenience of explanation, repeated contents will be omitted or briefly explained.

Referring to FIG. 6, in an example embodiment, the first to third master-slave status circuits 111, 211 and 311 may be initialized to the first signal of the first level at the first time point Ti by the first to third initial signals. The second and third master-slave status circuits 211 and 311 may store the second signal of the second level at the second time point Ts. Further, each of the first and second master-slave determination circuits 113 and 213 may receive the first signal of the first level from each of the second and third master-slave status circuits 211 and 311 at the first time point Ti, and may invert the first signal to output the second signal of the second level, and may provide the second signal to each of the second and third master-slave status circuits 211 and 311. The first level may be, for example, a logic high level (e.g., "1"). The second level may be, for example, a logic low level (e.g, "0").

Figure 7:
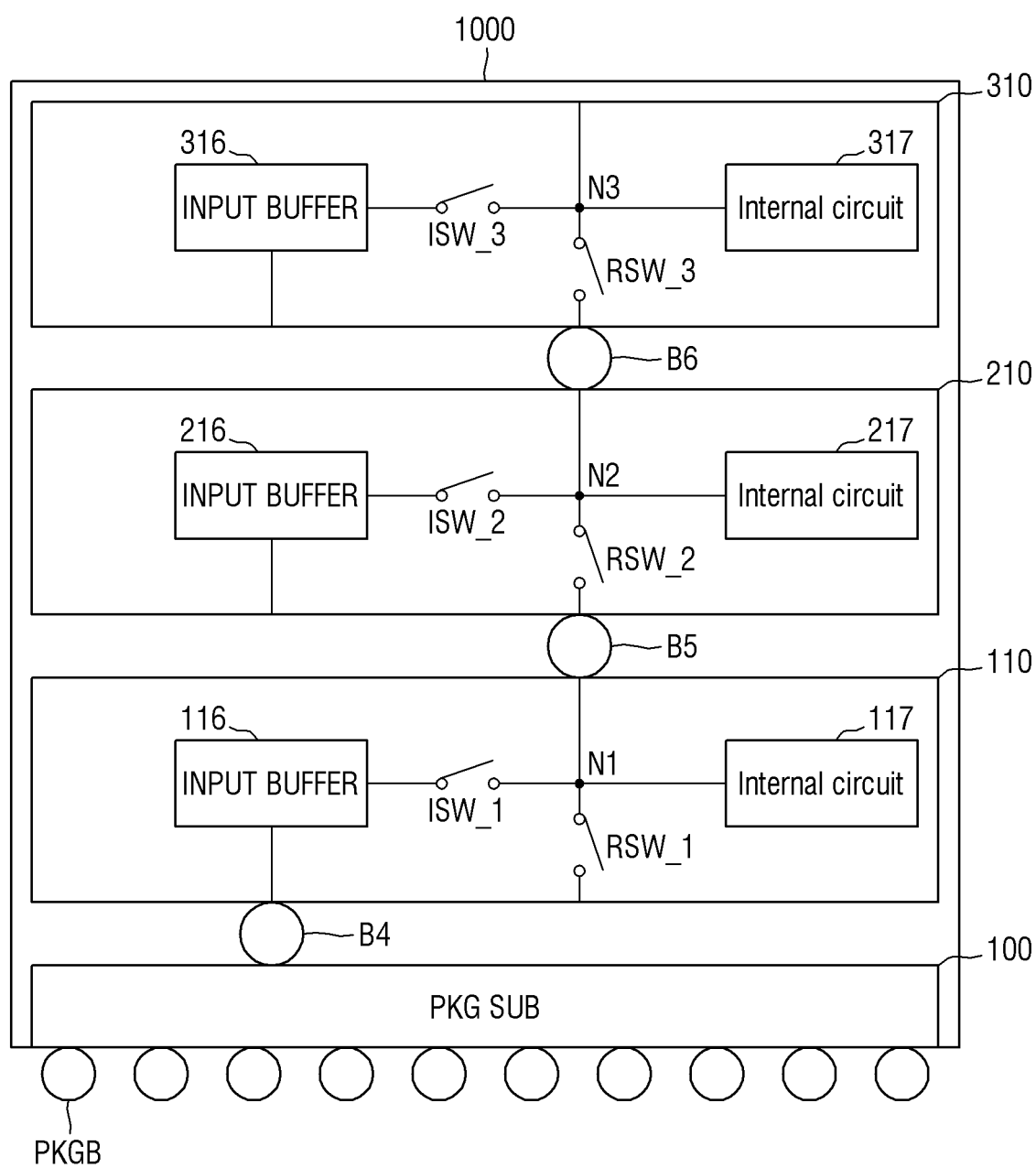
FIGS. 7 to 9 are example diagrams for explaining application of first to third master-slave status signals to the semiconductor package according to some example embodiments.
Figure 8:
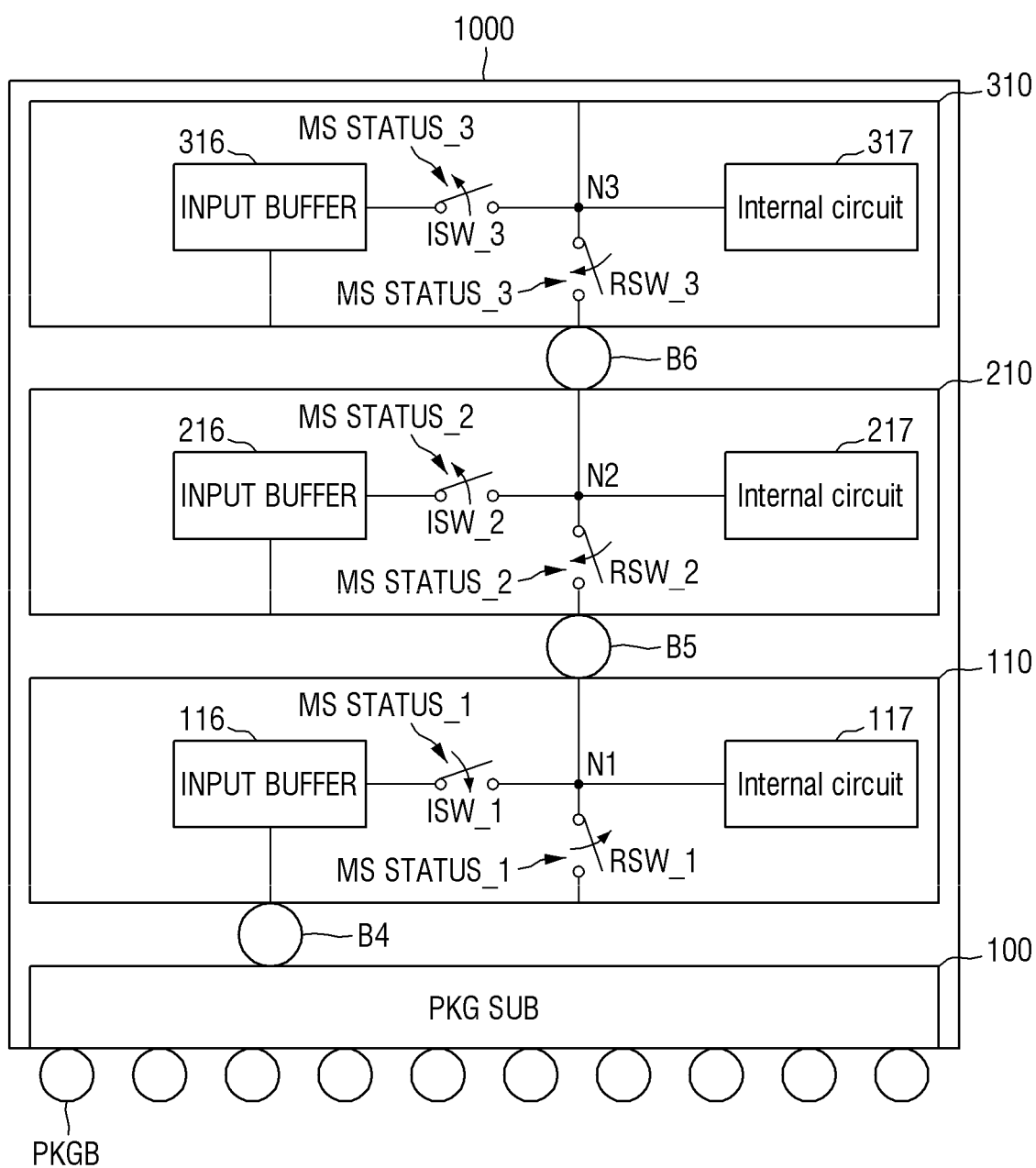
Figure 9:
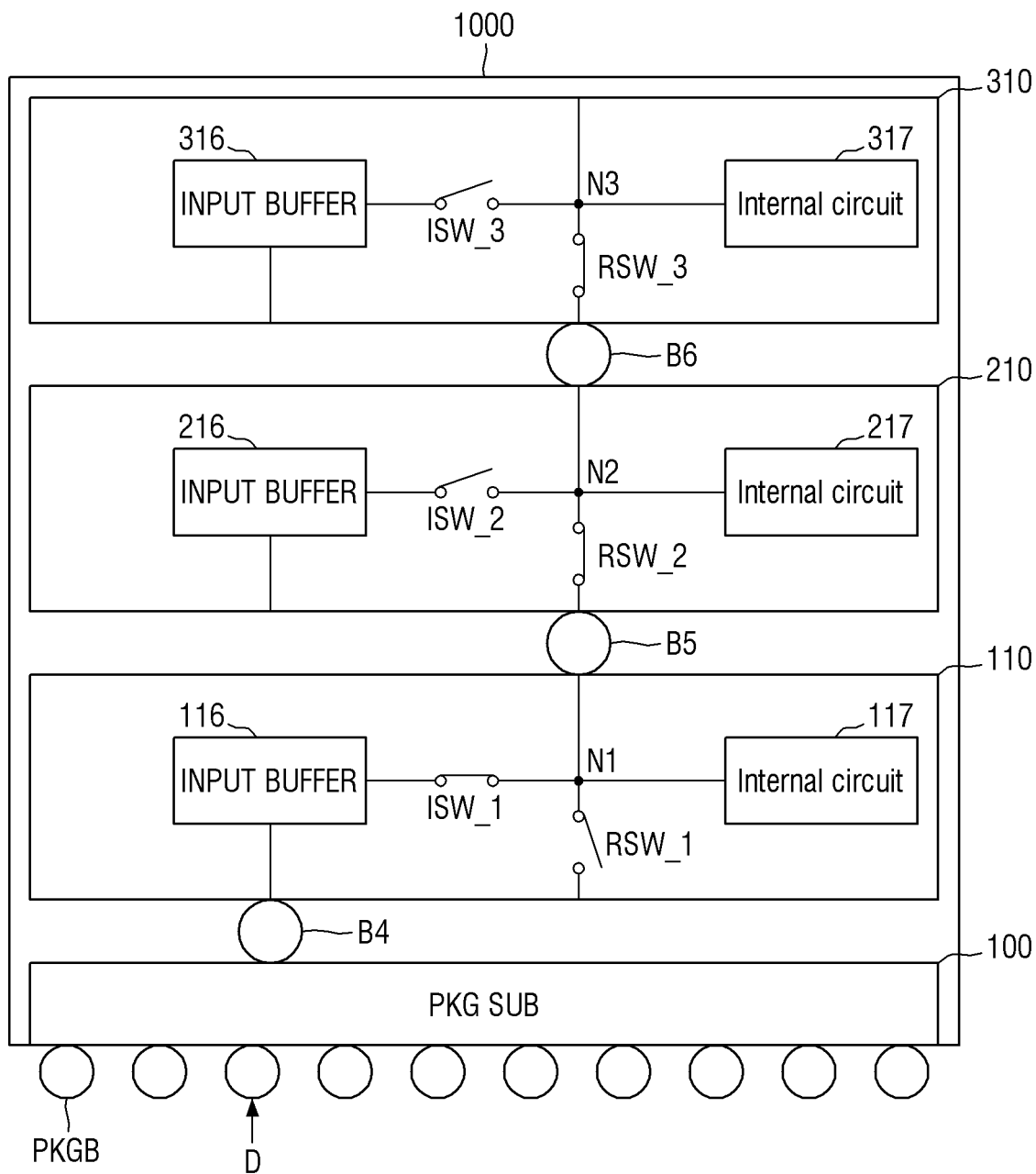

FIGS. 7 to 9 are example diagrams for explaining application of the first to third master-slave status signals MS STATUS_1 to MS STATUS_3 to the semiconductor package 1000, according to some example embodiments. For convenience of explanation, FIGS. 7 to 9 illustrate diagrams omitting the constituent elements illustrated in FIG. 1.

Referring to FIG. 7, the semiconductor package 1000 according to an example embodiment may include a package substrate 100, first to third chips 110, 210 and 310, a package ball PKGB, and fourth, fifth, and sixth bumps B4, B5, and B6.

The first chip 110 may include a first input buffer 116, a first internal circuit 117, a first input switch ISW_1, and a first reception switch RSW_1.

The first input buffer 116 may be connected to the first input switch ISW_1. Further, the first input buffer 116 may be connected to the package substrate 100 via the fourth bump B4. One end of the first input switch ISW_1 may be connected to the first input buffer 116 and the other end thereof may be connected to the first node N1. The first internal circuit 117 may be connected to a first node N1. The first node N1 may be connected to the fifth bump B5.

The second chip 210 may include a second input buffer 216, a second internal circuit 217, a second input switch ISW_2, and a second reception switch RSW_2. The second chip 210 may be connected to the first chip 110 via the fifth bump B5.

The second input buffer 216 may be connected to the second input switch ISW_2. One end of the second input switch ISW_2 may be connected to the second input buffer 216 and the other end thereof may be connected to a second node N2. One end of the second reception switch RSW_2 may be connected to the second node N2, and the other end thereof may be connected to the fifth bump B5. The second internal circuit 217 may be connected to the second node N2. The second node N2 may be connected to the sixth bump B6. The second node N2 may be connected to the fifth bump B5 via the second reception switch RSW_2.

The third chip 310 may include a third input buffer 316, a third internal circuit 317, a third input switch ISW_3, and a third reception switch RSW_3. The third chip 310 may be connected to the second chip 210 through the sixth bump B5.

The third input buffer 316 may be connected to the third input switch ISW_3. One end of the third input switch ISW_3 may be connected to the third input buffer 316, and the other end thereof may be connected to a third node N3. One end of the third reception switch RSW_3 may be connected to the third node N3, and the other end thereof may be connected to the sixth bump B6. The third internal circuit 317 may be connected to the third node N3. The third node N3 may be connected to the sixth bump B6 via the third reception switch RSW_3.

In some embodiments, the first to third input switches ISW_1 to ISW_3 and the first to third reception switches RSW_1 to RSW_3 may be controlled to be turned on/off by a control signal. For example, the first to third input switches ISW_1 to ISW_3 and the first to third reception switches RSW_1 to RSW_3 may be implemented as an NMOS, a PMOS, and/or a CMOS, and may be controlled to be turned on/off in accordance with the control signal which is input to the gate. The control signal may be provided by a processing device (not shown) included in the semiconductor package 1000. In some example embodiments, the control signal may be provided by the processing device, which is disposed outside the semiconductor package 1000.

The processing device may be implemented using one or more hardware device(s) configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a processing device may include multiple processors or a processor and a controller. In addition, different processing configurations are possible, such as parallel processors, multi-core processors, distributed processing, or the like.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, and/or computer storage medium or device. The software also may be distributed over network coupled computer systems so that the software is stored and executed in a distributed fashion. The software and data may be stored by one or more computer readable recording mediums.

Referring to FIG. 8, the first to third input switches ISW_1 to ISW_3 and the first to third reception switches RSW_1 to RSW_3 may be controlled to be turned on/off by the first to third master-slave status signals (MS STATUS_1 to MS_STATUS_3), respectively. For example, the first input switch ISW_1 and the first reception switch RSW_1 may be controlled to be turned on/off by the first master-slave status signal MS STATUS_1, the second input switch ISW_2 and the second reception switch RSW_2 may be controlled to be turned on/off by the second master-slave status signal MS STATUS_2, and the third input switch ISW_3 and the third reception switch RSW_3 may be controlled to be turned on/off by the third master-slave status signal MS STATUS_3.

Referring to an example embodiment illustrated in FIG. 7, the first input switch ISW_1 may be turned on by the first master-slave status signal MS STATUS_1, and thus the first input buffer 116 and the first internal circuit 117 may be connected to each other by the first master-slave status signal MS STATUS_1. Further, the second input switch ISW_2 may be turned off by the second master-slave status signal MS STATUS_2, and thus the second input buffer 216 and the second internal circuit 217 may be disconnected to each other by the second master-slave status signal MS STATUS_2, (thereby blocking signal or noise from the second input buffer 216 being provided to the second node N2. Still further, the third input switch ISW_3 may be turned off by the third master-slave status signal MS STATUS_3, and thus the third input buffer 316 and the third internal circuit 317 may be disconnected to each other by the third master-slave status signal MS STATUS_3 thereby blocking the signal or noise from the third input buffer 316 from being provided to the third node N3.

According to this example embodiment, because the first master-slave status signal MS STATUS_1 is a signal of a level different from the second and third master-slave status signals MS STATUS_2 and MS STATUS_3, the first input switch ISW_1 may execute an operation opposite to operations of the second and third input switches ISW_2 and ISW_3.

Referring to another example embodiment illustrated in FIG. 8, the first reception switch RSW_1 may be turned off by the first master-slave status signal MS STATUS_1. Thus, the signal or noise received by the first node N1 from the outside may be blocked by the first master-slave status signal MS STATUS_1. Further, the second reception switch RSW_2 may be turned on by the second master-slave status signal MS STATUS_2, thus the first node N1 and the second node N2 may be connected to each other by the second master-slave status signal MS STATUS_2. Still further, the third receiving switch RSW_3 may be turned on by the third master-slave status signal MS STATUS_3, and thus the second node N2 and the third node N3 may be connected to each other by the third master-slave status signal MS STATUS_3.

According to the example embodiments described above, because the first master-slave status signal MS STATUS_1 is a signal of a level different from the second and third master-slave status signals MS STATUS_2 and MS STATUS_3, the first reception switch RSW_1 may execute an operation opposite to operations of the third and second reception switches RSW_2 and RSW_3.

Referring to a still another example embodiment illustrated in FIG. 9, data D which is input from the outside may be provided to the package substrate 100 via the package ball PKGB. The data D may be provided to the first input buffer 116 via the fourth bump B4. The data D provided to the first input buffer 116 may be provided to the first internal circuit 117 via the first node N1. At this time, because the first reception switch RSW_1 is turned off, the data D may be provided to the first internal circuit 117 without damage, which may be caused by the signal and noise transmitted from the outside.

Further, the data D may be provided to the second node N2 via the fifth bump B5 and the second reception switch RSW_2. At this time, because the second input switch ISW_2 is turned off, damage to data D due to the second input buffer 216 and the noise may be mitigated or prevented. The data D provided to the second node N2 may be provided to the second internal circuit 217.

Further, the data D may be provided to the third node N3 via the sixth bump B6 and the third reception switch RSW_3. At this time, because the third input switch ISW_3 is turned off, damage to the data D due to the third input buffer 316 and noise may be mitigated or prevented. The data D provided to the third node N3 may be provided to the third internal circuit 317.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and are not used for purposes of limitation.

What is claimed is:

1. A semiconductor package comprising:
a first master-slave status circuit configured to store one of a first signal of a first level or a second signal of a second level, the first master-slave status circuit configured to store the first signal in response to receiving a first initial signal from a first initialization circuit, the first master-slave status circuit configured to store one of the first signal or the second signal independently from one of the first signal or the second signal stored in a second master-slave status circuit;
the second master-slave status circuit configured to store one of the first signal or the second signal, the second master-slave status circuit configured to store the first signal in response to receiving a second initial signal from a second initialization circuit;
the first initialization circuit configured to provide the first initial signal to the first master-slave status circuit;
the second initialization circuit configured to provide the second initial signal to the second master-slave status circuit; and
a first master-slave determination circuit connected to the second master-slave status circuit, the first master-slave determination circuit configured to provide the second signal to the second master-slave status circuit.

2. The semiconductor package of claim 1, wherein in response to power received from outside being equal to or higher than a desired level,
the first initialization circuit is configured to generate the first initial signal independently from the second initialization circuit, and provide the first initial signal to the first master-slave status circuit, and
the second initialization circuit is configured to generate the second initial signal independently from the first initialization circuit, and provide the second initial signal to the second master-slave status circuit.

3. The semiconductor package of claim 2, wherein in response to the power received from outside being equal to or higher than the desired level,
the first master-slave determination circuit is configured to receive the first signal from the second master-slave status circuit, invert the received first signal, and output the inverted first signal to the second master-slave status circuit as the second signal, and
the second master-slave status circuit is configured to receive and store the second signal from the first master-slave determination circuit.

4. The semiconductor package of claim 1, further comprising:
a first chip including the first master-slave status circuit, the first initialization circuit, and the first master-slave determination circuit; and
a second chip on the first chip, the second chip including the second master-slave status circuit, and the second initialization circuit.

5. The semiconductor package of claim 4, further comprising:
a third chip on the second chip, the third chip including a third master-slave status circuit configured to store one of the first signal or the second signal, and a third initialization circuit configured to provide a third initial signal to the third master-slave status circuit,
wherein the third master-slave status circuit is configured to store the first signal in response to receiving the third initial signal from the third initialization circuit, and
the second chip further includes a second master-slave determination circuit that is connected to the third master-slave status circuit and is configured to provide the second signal to the third master-slave status circuit.

6. The semiconductor package of claim 5, wherein
the first chip further includes a first through-silicon via (TSV) which connects the first master-slave determination circuit to the second master-slave status circuit, and
the second chip further includes a second through-silicon via which connects the second master-slave determination circuit to the third master-slave status circuit.

7. The semiconductor package of claim 6, further comprising:
a first bump between the first chip and the second chip; and
a second bump between the second chip and the third chip,
wherein the second chip further includes a first pad connected to the second master-slave status circuit,
the third chip further includes a second pad connected to the third master-slave status circuit, and
the first master-slave determination circuit is connected to the first through-silicon via, the second master-slave determination circuit is connected to the second through-silicon via, the first through-silicon via and the first pad are connected to the first bump, and the second through-silicon via and the second pad are connected to the second bump.

8. The semiconductor package of claim 4, wherein
the semiconductor package is configured to identify the first chip as a master chip in response to the first signal being stored in the first master-slave status circuit, and identify the first chip as a slave chip in response to the second signal being stored in the first master-slave status circuit, and
the semiconductor package is configured to identify the second chip as the master chip in response to the first signal being stored in the second master-slave status circuit, and identify the second chip as the slave chip in response to the second signal being stored in the second master-slave status circuit.

9. The semiconductor package of claim 8, wherein the first level is a logic low level and the second level is a logic high level.

10. The semiconductor package of claim 8, wherein the first level is a logic high level and the second level is a logic low level.

11. A semiconductor package comprising:
a first chip including,
a first master-slave status circuit configured to store one of a first signal of a first level or a second signal of a second level, and
a first initialization circuit configured to initialize the first master-slave status circuit; and
a second chip including,
a second master-slave status circuit configured to store one of the first signal or the second signal,
a second initialization circuit configured to initialize the second master-slave status circuit, and
a first master-slave determination circuit connected to the first master-slave status circuit, the first master-slave determination circuit configured to receive the one of the first signal or the second signal stored in the first master-slave status circuit, invert the one of the first signal or the second signal received from the first master-slave status circuit, and provide the inverted one of the first signal or the second signal to the first master-slave status circuit.

12. The semiconductor package of claim 11, wherein in response to a power received from outside being equal to or higher than a desired level,
the first initialization circuit is configured to initialize the first master-slave status circuit,
the second initialization circuit is configured to initialize the second master-slave status circuit, and
initialization of the first master-slave status circuit by the first initialization circuit is independently executed from initialization of the second master-slave status circuit by the second initialization circuit.

13. The semiconductor package of claim 12, wherein in response to the first and second master-slave status circuits being initialized, each of the first and second master-slave status circuits are configured to store the first signal.

14. The semiconductor package of claim 13, wherein in response to the power received from outside being equal to or higher than the desired level,
the first master-slave determination circuit is configured to receive the first signal from the first master-slave status circuit, invert the first signal, and provide the inverted first signal to the first master-slave status circuit as the second signal, and
the first master-slave status circuit is configured to receive and store the second signal received from the first master-slave determination circuit.

15. The semiconductor package of claim 11, wherein
the semiconductor package is configured to identify the first chip as a master chip in response to the first signal being stored in the first master-slave status circuit, and identify the first chip as a slave chip in response to the second signal being stored in the first master-slave status circuit, and
the semiconductor package is configured to identify the second chip as the master chip in response to the first signal being stored in the second master-slave status circuit, and identify the second chip as the slave chip when the first signal being stored in the second master-slave status circuit.

16. A semiconductor package comprising:
a first chip including,
a first master-slave status circuit configured to store one of a first signal of a first level or a second signal of a second level,
a first master-slave determination circuit configured to receive one of the first signal or the second signal from a second master-slave status circuit, invert the one of the first signal or the second signal, and provide the inverted one of the first signal or the second signal to the second master-slave status circuit, the first master-slave determination circuit connected to the second master-slave status circuit,
a first input buffer configured to store first data,
a first internal circuit configured to process the first data, and
a first switch configured to control a first connection between the first input buffer and the first internal circuit, based on a signal from the first master-slave status circuit; and
a second chip on the first chip, the second chip including,
the second master-slave status circuit configured to store one of the first signal or the second signal,
a second input buffer configured to store second data,
a second internal circuit configured to process the second data,
a second switch configured to control a second connection between the second input buffer and the second internal circuit based on a signal from the second master-slave status circuit, and a third switch configured to control a third connection between the first input buffer and the second internal circuit based on the signal from the second master-slave status circuit.

17. The semiconductor package of claim 16, wherein the first chip further comprises a first initialization circuit configured to initialize the first master-slave status circuit in response to a first determination that a first power received by the first chip is equal to or higher than a desired level, and the second chip further comprises a second initialization circuit configured to initialize the second master-slave status circuit in response to a second determination that a second power received by the second chip is equal to or higher than the desired level.

18. The semiconductor package of claim 17, wherein in response to the first and second master-slave status circuits being initialized, each of the first and second master-slave status circuits is configured to store the first signal.

19. The semiconductor package of claim 16, wherein in response to a power received from outside being equal to or higher than a desired level, the first master-slave determination circuit is configured to receive the first signal from the second master-slave status circuit, invert the first signal, and provide the inverted first signal to the second master-slave status circuit as the second signal, and the second master-slave status circuit is configured to receive and store the second signal from the first master-slave determination circuit.

20. The semiconductor package of claim 16, wherein the first switch is configured to the first input buffer to the first internal circuit in response to the first signal being stored in the first master-slave status circuit, and the second switch is configured to disconnect the second input buffer to the second internal circuit, and the third switch is configured to connect the first input buffer to the second internal circuit in response to the second signal being stored in the second master-slave status circuit.

* * * * *